US007099009B2

(12) United States Patent
DeGeorge et al.

(10) Patent No.: US 7,099,009 B2
(45) Date of Patent: Aug. 29, 2006

(54) AUTOMATED MATERIAL HANDLING LASER ALIGNMENT TOOL

(75) Inventors: Joseph P. DeGeorge, Wappingers Falls, NY (US); Robert R. Young, Jr., Staatsburg, NY (US)

(73) Assignee: International Business Machines Corporation, Armonk, NY (US)

( * ) Notice: Subject to any disclaimer, the term of this patent is extended or adjusted under 35 U.S.C. 154(b) by 295 days.

(21) Appl. No.: 10/754,232

(22) Filed: Jan. 8, 2004

(65) Prior Publication Data

US 2005/0151970 A1    Jul. 14, 2005

(51) Int. Cl.
    *G01B 11/00*    (2006.01)
(52) U.S. Cl. ....................................... 356/400
(58) Field of Classification Search ................ 356/400, 356/399; 414/416, 217; 250/548, 559.4
    See application file for complete search history.

(56) References Cited

U.S. PATENT DOCUMENTS

| 4,615,615 | A | 10/1986 | Krolak et al. |
| 6,034,763 | A | 3/2000 | Slater et al. |
| 6,286,219 | B1 | 9/2001 | Palumbo, II |
| 6,433,875 | B1 | 8/2002 | Kovac |
| 6,519,502 | B1 * | 2/2003 | Chao .......................... 700/213 |
| 6,541,787 | B1 * | 4/2003 | Lin et al. ................ 250/559.3 |
| 6,546,307 | B1 | 4/2003 | Hsiao |
| 6,817,823 | B1 * | 11/2004 | Fix et al. .................... 414/217 |
| 2002/0139001 | A1 * | 10/2002 | Chen .......................... 33/645 |
| 2002/0197136 | A1 * | 12/2002 | Huang et al. ............... 414/217 |
| 2003/0083776 | A1 | 5/2003 | Shauer et al. |

OTHER PUBLICATIONS

G. Ghezzi, et al., "Guidelines for the Installation and Alignment of 300 mm Overhead Transport Systems (OTS) and Load Port Interfaces", *International SEMATECH*, Technology Transfer #02064276A-ENG; Jun. 19, 2002.

* cited by examiner

*Primary Examiner*—Gregory J. Toatley, Jr.
*Assistant Examiner*—Isiaka O. Akanbi
(74) *Attorney, Agent, or Firm*—Scully, Scott, Murphy & Presser, P.C.; William H. Steinberg, Esq.

(57) ABSTRACT

An arrangement for aligning a semiconductor process tool to a track system, and a method which facilitates the calibration and alignment between a previously installed overhead transport system in a fabrication facility or plant for semiconductor wafers or integrated circuit components, and a plurality of load ports on a process tool for the semiconductor wafer or integrated circuit components, which is to be subsequently installed in the fabrication facility.

14 Claims, 3 Drawing Sheets

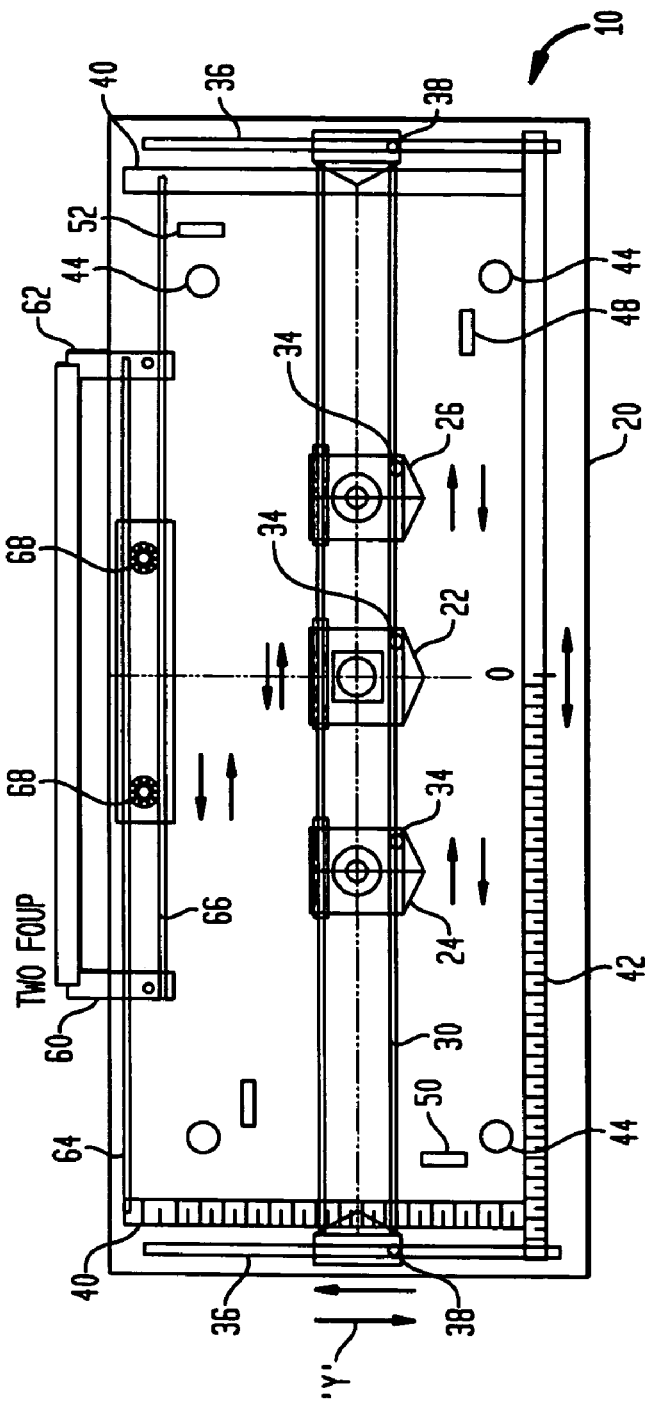

AUTOMATED MATERIAL HANDLING LASER ALIGNMENT TOOL

BACKGROUND OF THE INVENTION

1. Field of the Invention

The present invention relates to an arrangement for aligning a semiconductor process tool to a track system, and to a method which facilitates the calibration and alignment between a previously installed overhead transport system in a fabrication facility or plant for semiconductor wafers or integrated circuit components, and a plurality of load ports on a process tool for the semiconductor wafer or integrated circuit components, which is to be subsequently installed in the fabrication facility.

The concept of providing methods and arrangement for aligning a load port on a process machine or tool employed in the fabrication of various products, such as semiconductor wafers or integrated circuit components in a highly precisely aligned manner is widely known and employed in the applicable technology. In this connection, in many instances the overhead transportation systems utilized for the delivery of the components, which are to be processed, are installed subsequent to the positioning of the processing tool, which has been previously installed in the facility.

Generally, semiconductor fabricating equipment, which is provided for industrial fabrication installations (FABs), necessitate the provision of a large number of diverse processing or treatment chambers, modules, load ports and auxiliary equipment, which are assembled and fastened together in order to collectively form an equipment body, which is generally designated as a process tool. The particular process tool for the treatment of the semiconductor wafers or integrated circuit components is then operatively correlated in the fabrication facility with a number of mechanical connections which are provided for the supplying of process gasses, water, electrical power, HVAC, vacuum and exhaust, wherein the completed process tool assembly may be of a large and bulky size and processed of a weight in excess of several thousand pounds of assembled equipment and connections. Consequently, in the event that the orientation of the process tool equipment prior to assembly and installation in the fabrication facility is not correctly aligned with respect to the previously installed overhead track or transportation system which has been mounted in the fabrication facility, the integrity of the entire project in effecting the processing of the wafers is rendered doubtful in nature, and may necessitate the implementing of complex and costly modifications and production downtime in attempting to correct any misalignments which is present between the overhead track or transportation system and the process tool which is employed for the processing of the semiconductor wafers or integrated circuit chips.

Although installations and methods are currently known and employed in the technology for the alignment, and essentially optical alignment, between a FOUP load port of a process tool or wafer treating apparatus and an overhead transport system, this is generally implemented in that the overhead transport system is installed subsequently to the process tool, and thereafter, the load port on the process tool is aligned with the transport system. This is, essentially, a method of a nature which is subject to the problems as set forth hereinabove.

2. Discussion of the Prior Art

The publication of International SEMATECH, entitled "Guidelines for the Installation and Alignment of 300 mm Overhead Transports Systems (OTS) and Load Port Interfaces", Technology Transfer No. 02064276A-ENG, dated Jun. 19, 2002, discloses guidelines for the processing of 300 mm semiconductor wafers for integrated circuits, which pertains to the installation of a process equipment in alignment with an overhead transport system subsequent to the process tool being mounted in place in a fabrication facility. However, there is no disclosure of enabling such process tools, which posses multiple FOUP load ports to be aligned with a previously installed overhead transportation system in a manner analogous with the present invention, the latter of which employs a novel laser alignment apparatus for determining the accurate positioning of a process tool with a previously installed overhead transportation system.

The problem is also addressed in Lin, et al., U.S. Pat. No. 6,541,787 B2, which relates to the disclosure of an apparatus and a method for aligning a load port on a process tool or machine for 300 mm semiconductor wafers with an overhead transportation system. Again, although there is provided for an interface between a load port or a FOUP port, in effect a front opening unified port holding a plurality of 300 mm semiconductor wafers, does not this enable or disclose the alignment in a dynamic manner of a plurality of load ports on process tool installations relative to a previously installed overhead transport system employed in the fabrication facility.

Similar limitations in providing accurate alignments between process tools for semiconductor wafers and overhead transportation systems are encountered in the technology as represented by the disclosures of Schauer, et al., U.S. Patent Publication No. 2003/0083776 A1; Huang, et al., U.S. Patent Publication No. 2002/0197136 A1; Hsiao, U.S. Pat. No. 6,546,307 B1; Kovac, U.S. Pat. No. 6,433,875 B1; Palumbo, II, U.S. Pat. No. 6,286,219 B1; Slater, et al., U.S. Pat. No. 6,034,763; Krolak, et al., U.S. Pat. No. 4,615,615; and Brad Chen, German Patent Publication No. DE10033817 A1.

The prior art publications which are currently representative of the technology concerned with semiconductor manufacture and particularly in implementing precision alignment between an overhead track and a FOUP load port and kinematic load port interface fail to solve the problems encountered in the alignment between the locations of large scale and heavy semiconductor equipment or process tools and overhead track or transportation systems.

BRIEF SUMMARY OF THE INVENTION

In essence, in order to obviate or ameliorate the disadvantages and limitations encountered in the present state of the art, the inventive concept is directed to the provision of a novel alignment arrangement and method of facilitating a complicated installation of an accumulated assembly of hardware forming a process tool for the processing of semiconductor wafers relative to a previously installed overhead transportation system for the components which are being fabricated. Hereby, the alignment arrangement and method is adapted to provide for the subsequent placement of the process tool relative to survey marks or datum points to the previously installed overhead track or transportation system, through the employment of laser beam technology, so as to ensure that with the actual FOUP load ports installed on a kinematic interface, the bandwidth or range of kinematic adjustment between the alignment arrangement and transportation system, that this facilitates the final precise alignment between the subsequently positioned semiconductor process tool and the overhead track system.

Pursuant to the invention, the alignment arrangement and method of application thereof, facilitates that the x and y center lines, the process tool to be appropriately aligned with the overhead transport or track system, which has been previously installed in a fabricating facility and which normally extends at an elevation of approximately twelve (12) to eighteen (18) feet above the plant process floor. Basically, the alignment apparatus comprises a jig plate assembly and a multiple laser level plumb device, which facilitates the centering of the alignment plate assembly, which is a representative of a process tool, which is to be subsequently installed, relative to the overhead transportation system, which is basically a plant automated material handling system (AMHS), as is well known in the particular technology.

The use of the multiple lasers enable the alignment to be correlated with the AMHS without physically touching the overhead track, and the lasers enable the jig plate assembly to be leveled and vertically set in a precision orientation relative to the overhead track or transportation system. The semiconductor process tool alignment arrangement is then fastened to the plant floor, and two or more additional precision fixtures are attached to the jig plate assembly, which implements relative to a process tool. Thereafter, the process tool may be brought to the jig plate assembly and secured in its final position, after the alignment has been implemented to the previously installed overhead track or transportation system. This, in effect, facilitates a user to locate the cenetriod of each of the so-called load locations prior to the actual process tool being brought into the plant, thereby reducing the difficulties encountered in having to adjust and align the heavy and large scale components of the actual process tool.

Accordingly, it is an object of the present invention to provide a novel semiconductor process tool alignment for determining the precise correlation between load ports on a process tool for the fabrication of semiconductor components relative to an overhead transportation system in a fabrication plant.

Another object of the present invention resides in the provision of a semiconductor process tool alignment arrangement comprising a jig plate assembly with multiple laser level and plumbing devices enabling the centering of load ports of a process tool for the fabrication of semiconductor components relative to specific points or locations on an overhead transportation system.

Another object of the present invention resides in the provision of a method of precisely aligning load ports of a process tool employed in the fabrication of semiconductor components to an overhead transportation system, which has been previously installed in a fabrication facility prior to the subsequent installation of the actual process tool components.

BRIEF DESCRIPTION OF THE DRAWINGS

Reference may now be made to the following detailed description of preferred embodiments of the invention, taken in conjunction with the accompanied drawings; in which:

FIG. 3 illustrates the alignment arrangement of FIG. 2 adapted for a two FOUP port positioning alignment; and FIGS. 4 and 5 illustrate thereof the adjustment of the alignment arrangement to a three FOUP or a four FOUP port arrangement.

DETAILED DESCRIPTION OF THE PREFERRED EMBODIMENTS

Figure 1:
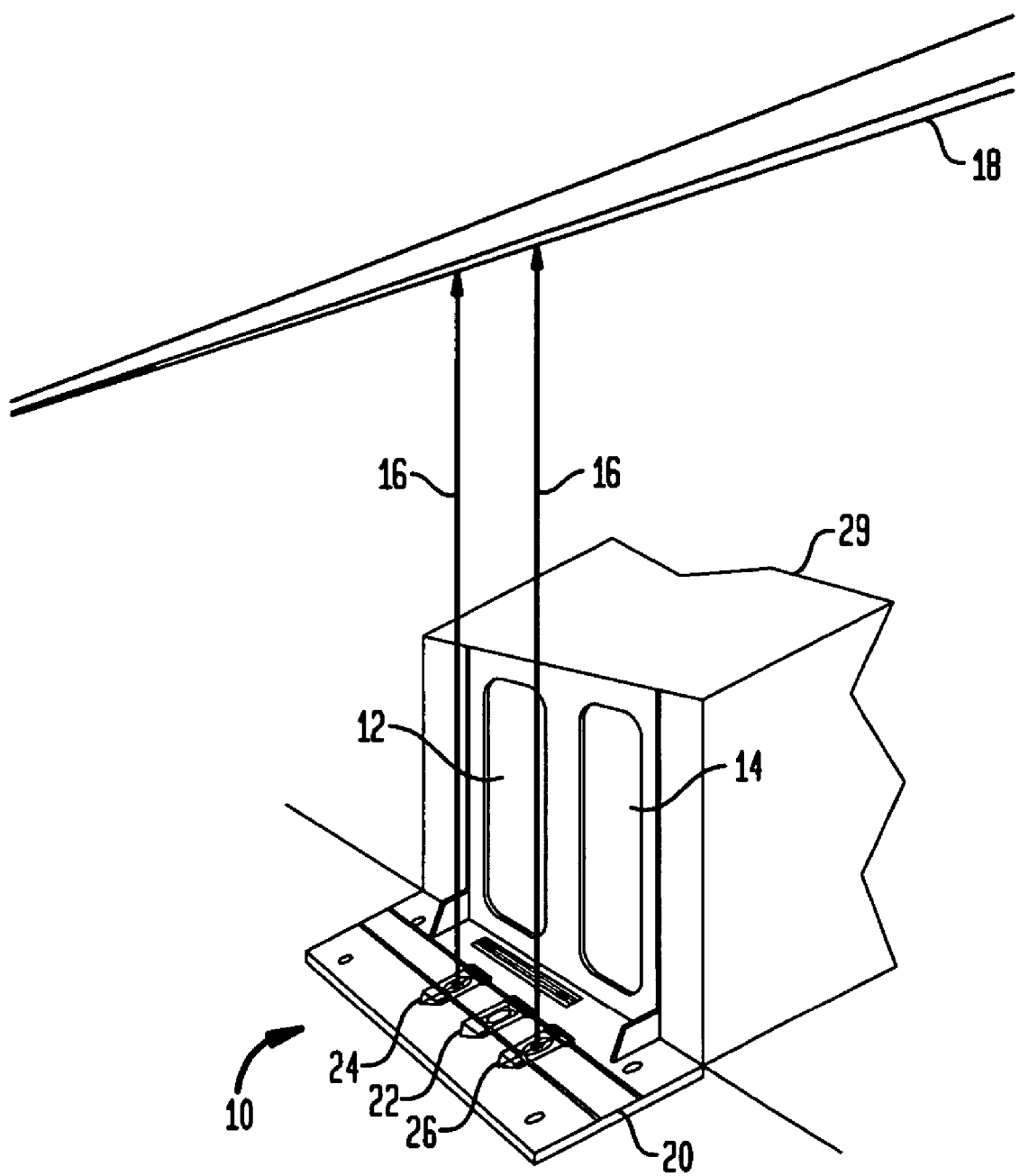
FIG. 1 illustrates a diagrammatic perspective representation of the interface between the inventive alignment arrangement for a multiple laser alignment of a process tool for semiconductor components with an overhead transport or track system in a fabrication plant.

Referring now in specific detail to the invention, as shown in FIG. 1, there is illustrated an overall representation of an alignment arrangement 10 for calibrating semiconductor process tool equipment relative to two FOUP load ports 12, 14 through a laser beam projection 16 to an automated overhead track system 18, the latter of which was previously installed in a fabrication plant or facility. As explained in detail hereinbelow, the alignment arrangement 10 comprises a jig base plate 20 supporting a primary laser mount 22 and at least two secondary laser mounts or prism attachments 24, 26; one at each side of the primary laser mount 22. The alignment arrangement, and in essence, the jig base plate 20, is adapted to have the laser beams 16 projected to suitable reference points or locations on the overhead track system 18, such beams being projected from the secondary laser mounts or prism attachments 24, 26, respectively, and with the central laser mount being directed so as to provide for alignment with a structure 29 providing for FOUP ports.

Figure 2:
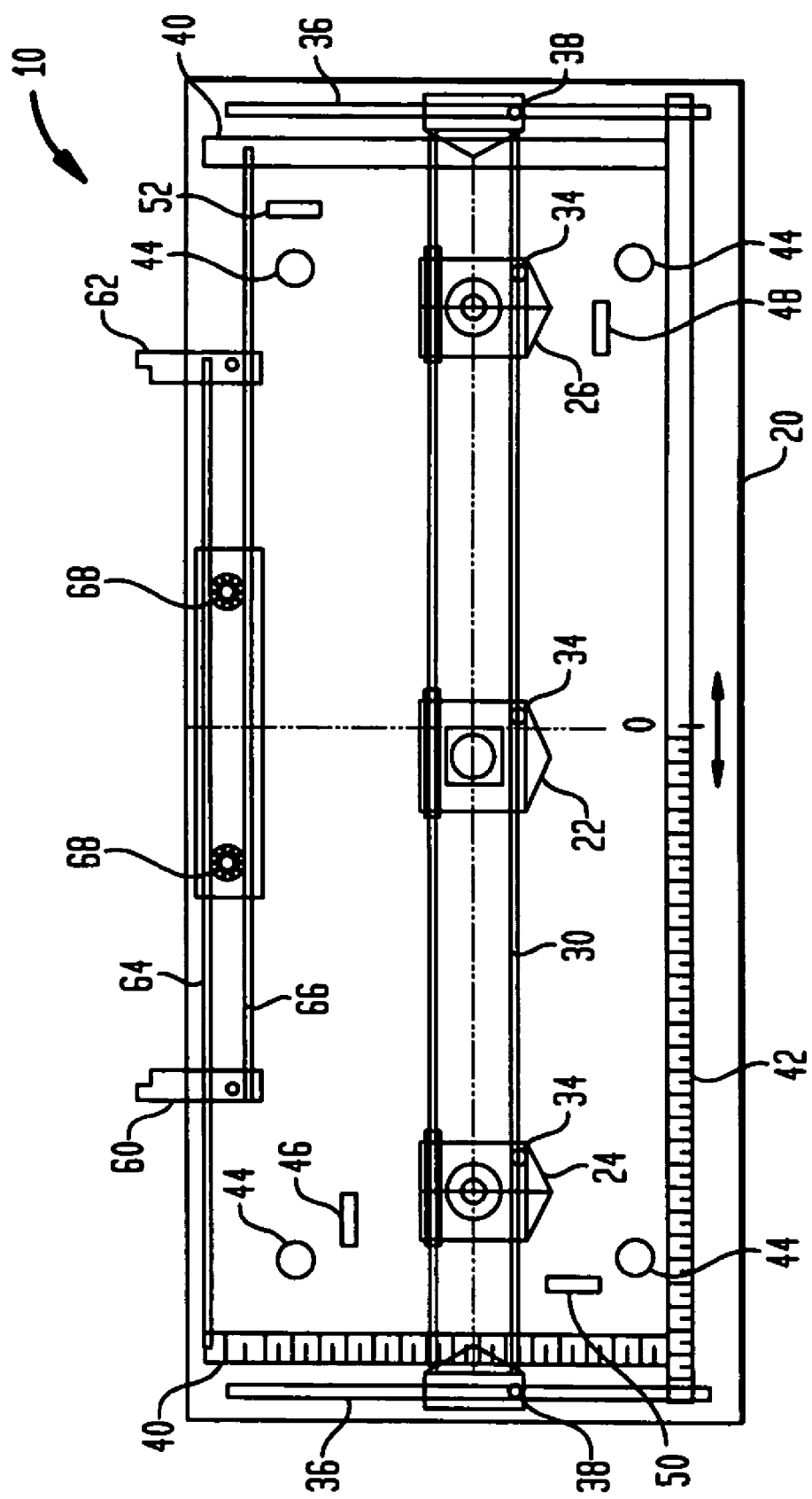
FIG. 2 illustrates a plan view of the alignment arrangement utilized to preset the location of load ports for a large semiconductor process tool relative to the overhead track system prior to the actual process tool deployment.

Referring to FIG. 2 of the drawings, there is illustrated in detail the alignment apparatus 10 presetting the location of the semiconductor process tool. The apparatus 10 includes jig base plate 20 supporting the primary laser mount 22 and also the secondary laser mounts or prism attachments 24, 26 flanking the primary laser mount and being supportedly spaced along a ball rail 30 for x-positional adjustment. The ball rail 30 may be a Thompson ball rail, as is known, on which the laser mounts 22, 24, 26 are lockable in adjustable positions by means of end horizontal position locking mechanisms 34 for each of the laser mounts.

Furthermore, provided on the jig base plate 20 is another ball rail 36 at each end of ball rail 30, for positioning in the y-direction, transversely of x-ball rail 30, at both ends thereof, which is also lockable and adjustable by means of the locking devices 38.

These locking devices 38 are mounted on ball slides, which may be Thompson ball slides as is known in the technology, and which facilitates the x-ball rail 30 being displaced in the y-direction.

Furthermore, provided on the jig base plate 20 are y-scales 40 adjacent the y-ball rails 36, which may be either in English or metric systems; and also an x-directional scale 42 for a horizontal English or metric system measurement.

The laser mounting jig base plate 20 is formed with a number of through holes 44, which will facilitate the plate being temporarily fastened to the fabrication facility floor. The jig base plate or laser mounting plate 20 is equipped with a pair of bubble levels 46, 48 for measuring the horizontal level, and also a pair of bubble levels 50, 52 to measure the level in a transverse direction to the horizontal.

Tool stop positioner brackets 60, 62 are provided on the jig base plate 20 so as to be reciprocatably adjustable along parallel guide rails 64, 66 through gearing 68. The brackets can be locked for equal movement to the right or left, based from the tool center line CL. Thus, the brackets 60, 62 can be selectively spread apart or brought together for multiple FOUP positions from a single tool center. For example, as indicated in FIG. 2 of the drawings, this bracket spacing is for a two FOUP position, as represented by the center line or also by the two side laser mounts or prism attachments 24, 26.

Alternately, the alignment apparatus 10 may have the brackets 60, 62 adjusted relative to each other regarding their mutual spacing so as to accommodate three FOUPs 70, as shown in FIG. 4, or four FOUPs 72, as shown in FIG. 5 of the drawings. The geared ball rails may be adapted to provide for different tool stop positions, and may consist of Thompson geared ball rails.

As indicated hereinbefore, the present alignment apparatus 10 provides the automated overhead material track or transport system 18 with an alignment to the locations of large scale and heavy semiconductor process tool equipment prior to the actual process tool arrival at its final fabrication plant locale.

Thus, the process tool is moved into position and a FOUP loader bracket employed for centering a 2,000 pound 300 mm wafer transport, and also acting as a physical hard stop with a laser reference position directed to the overhead track from the alignment fixture or apparatus. The apertures and laser beams then set the locations of the precision interface relative to the process tool. The alignment apparatus 10 is then temporarily fastened to the plant floor in a rigid manner employing the through holes 44 in the mounting or jig base plate 20 by bolting the latter to the floor.

In essence, the majority of semiconductor fabrication equipments components, which are provided for industrial fabrication locations, necessitate the employment of multiple chambers, modules, load ports and auxiliary equipment, which are literally bolted together to form an equipment body, referred to as a "process tool". Consequently, in the event that such process tools are not precisely located, this would require correction with respect to an overhead track system of extremely heavy process tool equipment, rendering the entire arrangement uneconomical and subject to errors in the accurate positioning thereof.

In contrast with the prior art, the present invention provides for a precise FOUP port alignment method and semiconductor process tool alignment arrangement relative to a previously installed overhead track system, so as to be able to commence the complicated installation of an accumulation of hardware forming the process tool in a manner whereby the final connection of the FOUP load port the process tool to a kinematic load port interface is correct and extremely accurate in an assured and entirely dependable manner.

While it is apparent that the invention herein disclosed is well calculated to fulfill the objects stated above, it will be appreciated that numerous modifications and embodiments may be devised by those skilled in the art, and it is intended that the appended claims cover all such modifications and embodiments as fall within the true spirit and scope of the present invention.

What is claimed is:

1. An alignment arrangement for aligning a semiconductor process tool to a track system; comprising:
   an alignment apparatus spaced at a predetermined location relative to said track system;
   said alignment apparatus being adapted for projecting laser beams toward said track system so as to facilitate centering and aligning said alignment apparatus with said track system;
   said alignment apparatus comprising a jig base member fastenable to a floor of a semiconductor fabrication facility, said track system including an automated overhead transport system for conveying semiconductor wafer-containing pods for processing of said wafer-containing pads by said process tool;
   said laser projecting arrangement comprising a plurality of laser mounts which are displaceably supported on said jig base member;
   wherein said plurality of laser mounts comprises a primary laser mount for initially centering said alignment apparatus to said track system; and secondary laser mounts or prism attachments for determining the alignment of FOUP load ports relative to said track system in a precision interface with said at least one process tool; and
   at least one semiconductor process tool in preset alignment with said track system.

2. An arrangement as claimed in claim 1, wherein said laser mounts are adjustably displaceable in x and y directions on said jig base member; and means for latching said laser mounts in specified locations on said jig base member.

3. An arrangement as claimed in claim 2, wherein said laser mounts are displaceably supported on ball rails arranged on said jig base member.

4. An arrangement as claimed in claim 2, wherein an adjustable tool stop positioning bracket is mounted for reciprocating displacement on said jig base member for positioning FOUP load ports in alignment with said track system responsive to a kinematic load port interface with said track system.

5. An arrangement as claimed in claim 4, wherein said tool stop positioner bracket is interchangeable with brackets of various lengths so as to accommodate different numbers of FOUP load ports.

6. An arrangement as claimed in claim 1, wherein said jig base member comprises a base plate temporarily bolted to the floor of a fabrication facility; and bubble levels being provided in said base plate for determining the leveling of said alignment apparatus when bolted to said floor.

7. An arrangement as claimed in claim 1, wherein said alignment apparatus is adapted to align a process tool with previously installed said track system transporting FOUP pods containing a plurality of 300 mm semiconductor wafers.

8. A method of providing an arrangement for aligning a semiconductor process tool to a track system, for aligning a semiconductor process tool to a track system; said method comprising:
   fastening an alignment apparatus spaced at a predetermined location relative to said track system;
   said alignment apparatus being adapted for projecting laser beams toward said track system so as to facilitate centering and aligning said alignment apparatus with said track system;
   said alignment apparatus comprising a jig base member fastenable to a floor of a semiconductor fabrication facility, said track system including an automated overhead transport system for conveying semiconductor wafer-containing pods by said process tool;
   said laser projection arrangement comprising a plurality of laser mounts which are displaceably supported on said jig base member; and
   wherein said plurality of laser mounts comprises a primary laser mount for initially centering said alignment apparatus to said track system; and secondary laser mounts or prism attachments for determining the alignment of FOUP load ports relative to said track system in a precision interface with said at least one process tool.

9. A method as claimed in claim 8, wherein said laser mounts are adjustably displaceable in x and y directions on said jig base member; and means for latching said laser mounts in specified locations on said jig base member.

10. A method as claimed in claim 9, wherein said laser mounts are displaceably supported on ball rails arranged on said jig base member.

11. A method as claimed in claim 9, wherein an adjustable tool stop positioner bracket is mounted for reciprocating displacement on said jig base member for positioning FOUP load ports in alignment with said track system responsive to a kinematic load port interface with said track system.

12. A method as claimed in claim 11, wherein said tool stop positioner bracket is interchangeable with brackets of various lengths so as to accommodate different numbers of FOUP load ports.

13. A method as claimed in claim 8, wherein said jig base member comprises a base plate temporarily bolted to the floor of a fabrication facility; and bubble levels being provided in said base plate for determining the leveling of said alignment apparatus when bolted to said floor.

14. A method as claimed in claim 8, wherein said apparatus is adapted to align a process tool with previously installed said track system transporting FOUP pods containing a plurality of 300 mm semiconductor wafers.

* * * * *